United States Patent
Birke et al.

(10) Patent No.: US 8,294,416 B2
(45) Date of Patent: Oct. 23, 2012

(54) METHOD AND DEVICE FOR CONTROLLING THE OPERATING POINT OF A BATTERY

(75) Inventors: Peter Birke, Glienicke/Nordbahn (DE); Michael Keller, Baden-Baden (DE); Manfred Malik, Penzberg (DE)

(73) Assignee: Conti Temic Microelectronic GmbH, Nurngberg (DE)

( * ) Notice: Subject to any disclaimer, the term of this patent is extended or adjusted under 35 U.S.C. 154(b) by 649 days.

(21) Appl. No.: 12/091,315

(22) PCT Filed: May 17, 2006

(86) PCT No.: PCT/DE2006/000846
§ 371 (c)(1),
(2), (4) Date: Apr. 24, 2008

(87) PCT Pub. No.: WO2007/048366
PCT Pub. Date: May 3, 2007

(65) Prior Publication Data
US 2008/0284378 A1  Nov. 20, 2008

(30) Foreign Application Priority Data
Oct. 28, 2005  (DE) .......................... 10 2005 052 868

(51) Int. Cl.
*H02J 7/00* (2006.01)
(52) U.S. Cl. ........................................ 320/107; 320/134
(58) Field of Classification Search ................... 320/107
See application file for complete search history.

(56) References Cited

U.S. PATENT DOCUMENTS

| | | | |
|---|---|---|---|
| 5,565,759 A | 10/1996 | Dunstan | |
| 5,945,808 A * | 8/1999 | Kikuchi et al. | 320/132 |
| 6,388,447 B1 * | 5/2002 | Hall et al. | 324/426 |
| 6,674,266 B2 | 1/2004 | Koch | |
| 2002/0030495 A1 | 3/2002 | Kechmire | |
| 2003/0057918 A1 * | 3/2003 | Aoki et al. | 320/136 |
| 2005/0119856 A1 * | 6/2005 | Emori et al. | 702/127 |
| 2006/0038532 A1 * | 2/2006 | Taniguchi | 320/103 |

* cited by examiner

*Primary Examiner* — Arun Williams

(57) ABSTRACT

Disclosed is a method for controlling the operating point (AP, AP1, AP2) of a battery (1), such as a lithium ion battery, a nickel metal hydride battery or a lithium polymer battery. The charging state (SoC1, SoC2) of the battery (1) is recorded as a state variable which determines the current operating point (AP1, AP2) of the battery (1). The current operating point (AP1, AP2) is set by a corresponding set value ($SoC_{AP1}$, $SoC_{AP2}$) for the charging state (SoC1, SoC2) which is continuously adjusted depending on the temperature (T) and/or on the age state (SoH) of the battery.

11 Claims, 2 Drawing Sheets

METHOD AND DEVICE FOR CONTROLLING THE OPERATING POINT OF A BATTERY

This application is the U.S. national phase of international application PCT/DE2006/000846 filed May 17, 2006, which designated the U.S. and which claims the benefit of priority of German Patent Application Number 10 2005 052 868.6 filed Oct. 28, 2005. The contents of each of the aforementioned documents are incorporated herein in their entirety.

BACKGROUND OF THE INVENTION

The invention relates to a method and a device for controlling the operating point of a battery, in particular a secondary battery, for a motor vehicle, in particular for the purpose of automatically setting the operating point. A secondary battery is considered to be a re-chargeable storage unit (also known as a storage battery or secondary storage unit), as opposed to a primary battery which cannot be re-charged. The word "battery" as used below refers in all cases to a secondary battery. In particular, a nickel metal hybrid battery, a lithium ion battery, a lead battery or a lithium polymer battery or another suitable, re-chargeable storage unit is used in particular as a motor vehicle battery. The operating point of the battery is here in particular considered to be the setting of the charging state of the battery in which an optimum, i.e. a maximum, working life-extending, input or removal of power is possible.

Currently, ever increasing demands are made on vehicle batteries due to the increasing number of electrical systems and the addition of systems which also need to be supplied when the motor vehicle is switched off. Thus, diesel engines require high currents, in particular at low temperatures (high cold-start power) and motor vehicles with electric equipment such as electro-hydraulic brake systems require constant battery availability for safety reasons.

Here, the capacity, i.e. the quantity of current which can be removed under certain conditions, depends strongly on non-electrical parameters such as ambient temperature, cell temperature and age. Of particular significance is the strongly temperature-dependent behaviour of a battery. Thus for example, the capacity and the charge state of a nickel metal hydride battery (also abbreviated to NiMH battery) depend strongly on the ambient temperature due to the hydrogen storage alloy used in the negative electrode. At low temperatures, hydrogen with worse dismantling and installation kinetics is emitted and absorbed by the negative electrode. At higher temperatures, the hydrogen absorption and thus the chargeability is noticeably negatively influenced by the negative electrode, since with the increasing temperature, a hydrogen counter-pressure is built up. These temperature-dependent effects occur with modern, metal hydride storage units (also known as "hydrogen tanks") with which hydrogen is well bonded in a hydrogen storage alloy, but is also expelled again by heat. As a result, the capacity and therefore the removal are restricted.

Furthermore, the capacity, i.e. the removable charge or current quantity, depends strongly on the charging state of the battery. Modern batteries such as nickel metal hydride batteries or lithium ion batteries comprise a high power density of up to 1.8 kw per kg or 3 kW per kg, so that a high level of removal and good chargeability at low temperatures is already partially possible.

In order to be able to retain the different electrical functions of the motor vehicle while driving, such as the start function or safety functions, the battery availability is usually monitored constantly. In this regard, it is known how to determine the battery state, e.g. the charging state, the capacity and/or the age of the battery and from this information, to determine the current power rating of the battery. Here, methods of this type are generally based on expensive current and voltage measuring procedures, or on expensive model calculations based on experience.

It is thus known from DE 199 18 529 B4 how to determine the charging state and/or the capacity of a battery based on a measurement of the battery current and a calculation of a measured removed charge from the time progression of the battery current, taking into account the open-circuit voltage of the battery.

The known methods here enable the determination of the removable charge (=discharging) and the charging ability (=charging) of the battery in its capacity range, based on the current and voltage measurement, and taking into account the charging state of the battery. Thus, a nickel metal hydride battery is able to operate with full charging and discharging power in a capacity range of between 30% and 70%, due to the high power density. When the battery has reached a charging state of 90%, the charging is strongly restricted, since otherwise, harmful overcharging of the battery may occur, which could lead to a significant reduction in the working life of the battery.

The object of the invention is to provide a method for controlling the operating point of a battery, so that an optimal utilisation of the capacity range of the battery is made possible. The object is also to provide a particularly suitable device.

SUMMARY OF THE INVENTION

The object is attained according to the invention by a method for controlling the operating point (AP, AP1, AP2) of a battery (1), such as a lithium ion battery, a nickel metal hydride battery, a lithium polymer battery, in which the charging state (SocC1, SoC2) of the battery (1) is recorded as the state variable which determines the operating point (AP1, AP2) of the battery (1), wherein the current operating point (AP1, AP2) is set by means of a corresponding set value ($SoC_{AP1}$, $SoC_{AP2}$) for the charging state (SoC1, SoC2) which is continuously adjusted depending on the temperature (T) and/or on the age state (SoH). The object is also achieved by a device for conducting a method for controlling the operating point (AP, AP1, AP2) of a battery (1), in particular of a lithium ion battery, a nickel metal hydride battery, a lithium polymer battery, comprising at least one processor which is in particular part of a control device (4), by means of which the operating point (AP1, AP2) of the battery (1) can be set continuously using a set value for the charging state (SoC1, SoC2) which is dynamically adjusted on the basis of the temperature (T) and/or the age state (SoH) of the battery (1).

According to the invention, with the method for controlling the operating point of a battery, in particular of a lithium ion battery, a nickel metal hydride battery or a lithium polymer battery, the current charging state of the battery is recorded as a state variable which determines the operating point of the battery, wherein the current operating point is set by means of a corresponding set value for the charging state which is continuously adjusted depending on the temperature and/or on the age of the battery. A temperature and/or age-dependent adjustment of the specified set value for the charging state of the battery enables a dynamic setting of the operating point of the battery, as a result of which the working life and duration of operation of the battery can be significantly extended. In addition, the battery is optimised for an electric drive with a hybrid vehicle in terms of the time available and the power which can be drawn.

Advantageously, the current set value for the charging state is adapted on the basis of a specified first characteristic curve, in particular, a set value characteristic curve, according to the following ratio:

$$SoC_{AP}=SoC_{set}(T) \quad [1]$$

with $SoC_{AP}$=charging state value in the operating point, $SoC_{set}(T)$=set value for the charging state depending on the temperature T.

In other words: the set value for the charging state is continuously adjusted in dependence on the temperature. As a result, temperature-dependent negative effects, such as a too low charging state at low temperatures, or a too high charging state at high temperatures, can be offset by adapting the set value for the charging state on the basis of the temperature characteristic curve. During this process, at low temperatures and with a low charging state, power is also supplied in order to compensate an anticipated voltage drop. By contrast, at high temperatures and with a high charging state, the battery is discharged if appropriate, in order to compensate the hydrogen counterpressure.

During this process, the current charging state of the battery is determined, for example on the basis of standard measuring methods, in particular on the basis of a continuous measurement of the battery current and the absorbed and/or removed charge, e.g. using an Ah counter (Ah=ampere hours). With another method, the current charging state can be determined on the basis of an open-circuit voltage measurement method.

The temperature characteristic curve for determining the current set value for the charging state here takes into account the ambient temperature in particular as the temperature. Depending on the degree of precision of the method, further, addition temperature parameters such as the battery temperature, in particular the cell temperature, can be recorded and taken into account.

Furthermore, the available capacity of a battery depends to a large extent on its age. In addition or as an alternative, the current set value for the charging state can therefore be adapted using an age-dependent correction factor and on the basis of a specified second, in particular age-dependent characteristic curve for the correction factor, and can be adjusted. The age-dependent characteristic curve contains a correction factor for the charging state depending on the age of the battery. During this process, the age-dependent correction factor is used for correcting the set value or alternatively the actual value for the charging state, and thus the following ratios are used for setting the operating point of the battery:

$$SoC_{AP}=SoC_{set}(T)*SoC_{corr} \quad [2.1]$$

$$SoC_{AP}=SoC_{set}(T)*SoC_{set}/SoC_{act} \quad [2.2]$$

with $SoC_{AP}$=charging state value in the operating point, $SoC_{set}(T)$=set value for the charging state, depending on the temperature T and measured at the temperature of $SoC_{act}$, $SoC_{corr}$=age-dependent correction factor, $SoC_{act}$=actual temperature value.

In other words: the current charging state or the operating point of the battery can be adjusted on the basis of an age-dependent correction factor using a corresponding second characteristic curve. An adjustment of this type is required due to reversible and irreversible electrochemical operating and ageing processes in the battery.

The temperature-dependent or age-dependent setting of the operating point can be conducted either in combination or as an alternative. For example, with a fresh, new battery, only the temperature-dependent setting of the operating point is selected. With an older battery, however, the age-dependent setting is added, or is taken into account as an alternative.

The age-dependent correction factor can be determined in the standard manner on the basis of a model-based estimation method for the capacity and power rating of the battery. Furthermore, the age of the battery is determined and compared with the stored values of a fresh battery.

If the adapted set value for the charging state is not reached by the current charging state value, a compensation charge is advantageously conducted. After the compensation charge has been completed, the current charging state is again determined. If this current charging state continues to fail to reach the adapted set value for the charging state, a test is made as to whether following a corresponding adaptation of the age-dependent correction factor by increasing the age by a value greater than 1, the age still lies within a functional range. If this is not the case, the battery needs to be replaced.

With the device according to the invention for conducting the method for controlling the operating point, in one embodiment, at least one processor, which is in particular part of a control device, is provided, by means of which the operating point of the battery can be set continuously using a set value for the charging state which is dynamically adjusted on the basis of the temperature and/or the age of the battery.

The advantages attained with the invention are in particular that in addition to the standard determination of the charging state, for example using current and voltage measurements, the charging state is adjusted, i.e. adapted, depending on temperature and age. This type of adjustment of the charging state of the battery using temperature and age results in a significantly longer working life and duration of operation of the battery, and an optimum use of the available time and power for the operation of a motor vehicle, in particular for the electric drive mode of a hybrid motor vehicle. Here, the charging state is dynamically adjusted to an updated and optimum operating point as a function of the temperature and age of the battery. The updated operating point enables in particular the functions typical for the hybrid mode of a hybrid motor vehicle, such as "boosting", "recuperating" or "charging" the battery, or "current removal" from the battery with a long working life and a high availability of the battery.

BRIEF DESCRIPTION OF THE DRAWINGS

Exemplary embodiments of the invention will be explained in greater detail with reference to a drawing, in which.

DETAILED DESCRIPTION OF THE DRAWINGS

Figure 1:
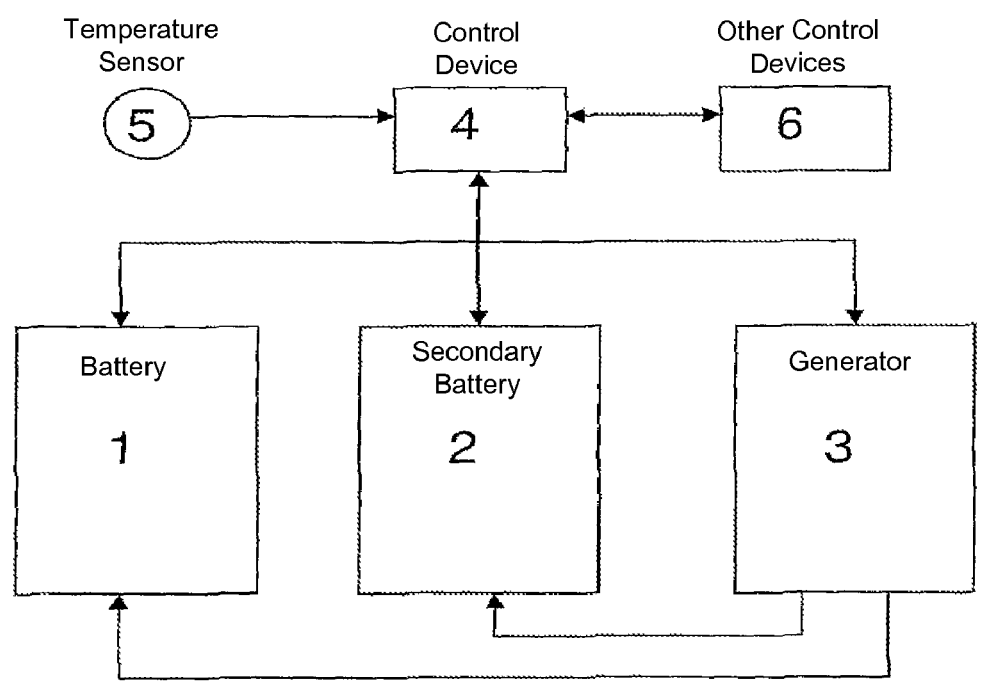
FIG. 1 shows a schematic view of a device for controlling the operating point of a battery, depending on the temperature and/or the age of the battery

FIG. 1 shows a device for controlling the operating point of a battery 1 for a motor vehicle. The battery 1 can be a battery for use in an energy storage unit for a hybrid motor vehicle, also referred to below as a traction battery. For example, a nickel metal hydride battery or a lithium ion battery is used as a traction battery. Furthermore, an additional, secondary battery 2 can be provided in the form of a lead acid battery. The batteries 1 and 2 are charged while driving by means of a generator 3.

In order to control the batteries 1 and 2, the device comprises a control device 4 such as a battery control device or an on-board electrical system control device, which is connected with the battery 1 and the secondary battery 2, as well as with the generator 3. By means of the control device 4, as parameters of the battery 1 and the secondary battery 2, the charging state SoC of said batteries is recorded, for example on the basis of voltage and/or current and/or temperature measurements.

Furthermore, by means of a temperature sensor 5, the ambient temperature is recorded as the temperature T. Alternatively or in addition to this, the respective battery or cell temperature can be recorded as the temperature T.

Furthermore, in order to determine the age state SoH of the battery 1 or 2, data is required as a result of e.g. surface passivation of the electrodes of the battery, gradual drying of the battery cells, contact losses and an increase in cell impedances resulting from these processes, as well as a reduction in battery capacity in relation to the same discharging final voltage. This data can be recorded and taken into account when determining the age state SoH, for example by means of a model-based estimation method. In particular with NiMH batteries, charging state deviations of individual battery cells within a serial connection can be taken into account, wherein an annulment of the deviations caused by a compensation charge can also be recorded and evaluated.

In order to take into account further parameters which are relevant to the motor vehicle such as the vehicle speed, the control device 4 can for example be connected with other control devices 6, the brake control device.

During standard operation of a motor vehicle, the on-board electrical system battery in modern vehicles is monitored continuously for its charging state SoC in order to ensure sufficient supply to the electric consumers such as ignition, fuel injection, lighting, heating, air conditioning and braking. During normal operation of the traction battery 1, such as a nickel metal hydride battery, the charging state SoC should lie within a charging state range of between 50% and 60% for a fresh battery.

According to the invention it is provided that not only the current charging state SoC is continuously recorded, but also to set the optimum operating point AP of the battery 1 using a set value $SoC_{set}$ for the charging state SoC in such a manner that the temperature T and/or the age state SoH of the battery 1 is taken into account.

Figure 2:
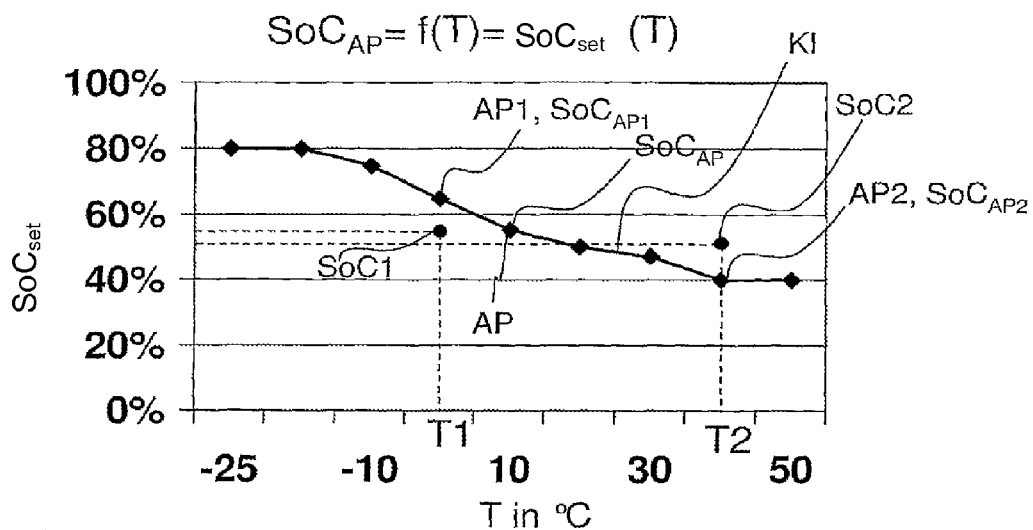
FIG. 2 shows a first temperature-dependent characteristic curve for specifying a set value for the charging state of the battery.

For this purpose, the set value $SoC_{set}$ for the charging state SoC is continuously specified on the basis of a first, temperature-dependent characteristic curve KI, which is shown in FIG. 2. Here, the set value $SoC_{set}$ for the charging state SoC is continuously adjusted on the basis of the current temperature T according to the ratio [1].

If in driving mode, a low charging state SoC1 arises at a low temperature T1, as a result of the specified set value $SoC_{AP1}$ which is adjusted in dependence on the temperature for the charging state SoC1 by means of the control device 4, a corresponding operating point AP1 is set, wherein a charging of the battery 1 is effected and a discharging of the battery 1 by the generator 3 is suppressed. If however the charging state SoC2 is too high at a high temperature T2, as a result of the temperature-dependent adjustment of the set value $SoC_{AP2}$ for the charging state SoC2, the corresponding operating point AP2 is set accordingly, wherein by means of the control device 4, a discharging of the battery 1 is effected, for example by the generator 3.

Figure 3:
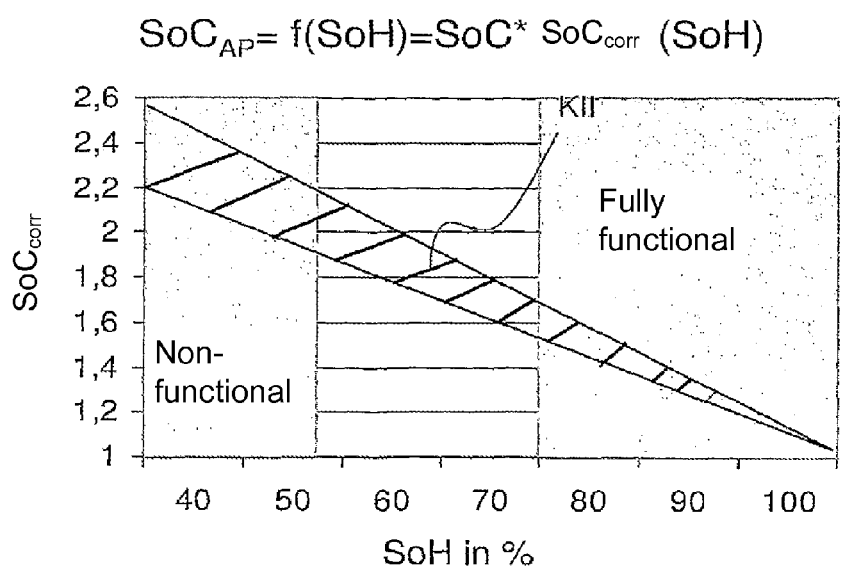
FIG. 3 shows a second age-dependent characteristic curve for specifying a correction value for the charging state value in the operating point, depending on the age of the battery Parts which correspond to each other are assigned the same reference numerals in all Figures.

Furthermore, in order to take into account the age state SoH of the battery 1, a second, age-dependent characteristic curve KII can be used in order to set the respective operating point AP of the battery 1. The second characteristic curve 11, which is shown in greater detail in FIG. 3, is here used to determine an age-dependent correction factor $SoC_{corr}$ for the charging state SoC. The age-dependent correction factor $SoC_{corr}$ results as a function of the determined age state SoH of the battery 1. The age state SoH is in the standard manner determined for example using corresponding algorithms such as model-based estimation methods for determining the power rating of the battery, in particular its availability or functionality. If the battery 1 has a fully functional age state SoH of greater than 70%, or a restricted functional age state SoH of between 50% and 70%, the correction factor $SoC_{corr}$ is taken into account when setting the current operating point AP of the battery 1. At the restricted functional age, a compensation charge is recommended in the case of an NiMH battery, following which the age state SoH is again determined. If the battery 1 is not of a functional age state SoH, an exchange of the battery 1 is issued.

While the age state SoH is being determined, in the case of an NiMH battery, electrochemical operating and ageing processes are also taken into account in a differentiated manner, and are divided into irreversible and reversible processes. As irreversible processes, surface passivation of the electrodes, gradual drying of the cells, contact losses and resulting increases in cell impedances and reduction in capacity are for example taken into account by means of the correction factor $SoC_{corr}$ in relation to the same discharging final voltage. As reversible processes, deviations between cells within a serial connection are for example taken into account. Depending on this, in the case of an NiMH battery, a compensation charging of the battery 1 by means of the control device 4 is recommended while driving or at the next stop, or during the next service, and is activated if appropriate. If as a result of the compensation charge the age state SoH fails to reach the specified value, e.g. 100% for full functionality, the operating point AP is raised by means of the correction factor $SoC_{corr}$.

Depending on the setting and the state of the battery 1, the operating point AP can only be set on the basis of the first temperature-dependent characteristic curve KI or only on the basis of the second age-dependent characteristic curve KII or on the basis of both characteristic curves KI and KII according to the ratios [1] to [3], wherein the set value $SoC_{AP}$ is adjusted accordingly in dependence on the temperature and/or the age.

If the battery 1 is fresh and new, only the temperature-dependent characteristic curve KI is used to set the operating point AP. However, with an older battery 1 and normal ambient temperatures, only the age-dependent characteristic curve KII is used to set the operating point AP.

The process described of taking into account the age state SoH and temperature T on the basis of characteristic curves KII or KI for adjusting the set value $SoC_{AP}$ for the charging state enables a significant extension of the duration of operation of the battery 1.

LIST OF REFERENCE NUMERALS

1 Battery
2 Secondary battery
3 Generator
4 Control device
5 Temperature sensor
6 Further control devices AP Operating point
KI, KII Characteristic curves
SoC Charging state
$SoC_{set}$ Set value for the charging state
$SoC_{act}$ Actual value for the charging state
$SOC_{corr}$ Correction factor
SoH Age state
T Temperature

The invention claimed is:

1. A method for controlling the operating point(AP, AP1, AP2) of a battery (1), such as alithium ion battery, a nickel metal hydride battery, or a lithium polymer battery, the method comprising:
   recording a charging state (SoC1, SoC2) of the battery (1) as a state variable,
   setting corresponding operating points (AP1, AP2) by means of corresponding set values ($SoC_{AP1}$, $SoC_{AP2}$) for the charging state (SoC1, SoC2), the corresponding set values ($SoC_{AP1}$, $SoC_{AP2}$) are continuously adjusted depending on a temperature (T) and an age state (SoH).

2. A method according to claim 1, wherein which the current set value ($SoC_{AP1}$, $SoC_{Ap2}$) is adapted for the charging state (SoC1, SoC2) on the basis of a specified temperature-dependent characteristic curve (KI).

3. A method according to claim 1, wherein the current charging state (SoC1, SoC2) of the battery (1) is determined on the basis of a measurement,of the battery current and the charge which is absorbed or removed.

4. A method according to claim 1, wherein the current charging state (SoC1, SoC2) is determined based on at least one of an open-circuit voltage measurement method and a model-based estimation method.

5. A method according to claim 1, wherein at least one of an ambient temperature, a battery temperature, and a cell temperature is recorded as the temperature (T).

6. A method according to claim 1, wherein the current set value ($SoC_{AP1}$, $SoC_{AP2}$) for the charging state (SoC1, SoC2) is adapted by means of an age-dependent correction factor ($SoC_{corr}$) and on the basis of a specified second.

7. A method according to claim 6, wherein the age-dependent correction factor ($SoC_{corr}$) is determined on the basis of a model-based estimation method for the capacity and power rating of the battery (1).

8. A method according to claim 6, wherein an age state (SoH) of the battery (1) is determined based on at least one of a voltage measurement method, a current measurement method and model-based estimation method.

9. A method according to claim 6, wherein when the adapted set value ($SoC_{Ap2}$) for the charging state (SoC2) is not reachd by the current charging state value, a compensation charge is conducted.

10. A method according to claim 9, wherein after the compensation charge has been completed, the age-dependent correction factor ($SoC_{corr}$) is set to a value greater than 1.

11. A device for conducting a method for controlling on operating point (AP, AP1, AP2) of a battery (1), such as a lithium ion battery, a nickel metal hydride battery, or a lithium polymer battery, the device comprising:
    at least one processor which is part of a control device (4), wherein the processor is used so that an operating point (AP1, AP2) of the battery (1) can be set continuously using a set value for the charging state (SOC1, SOC2) which is dynamically adjusted based on at least one of a temperature (T) and an age state (SoH) of the battery (1).

* * * * *